US006774650B2

(12) United States Patent
Maruyama et al.

(10) Patent No.: US 6,774,650 B2
(45) Date of Patent: Aug. 10, 2004

(54) PROBE CARD AND METHOD OF TESTING WAFER HAVING A PLURALITY OF SEMICONDUCTOR DEVICES

(75) Inventors: Shigeyuki Maruyama, Yokohama (JP); Daisuke Koizumi, Hino (JP); Naoyuki Watanabe, Kawasaki (JP); Yoshito Konno, Niiza (JP); Eiji Yoshida, Kawasaki (JP); Toshiyuki Honda, Yokohama (JP); Toshimi Kawahara, Kawasaki (JP); Kenichi Nagashige, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/392,925

(22) Filed: Mar. 21, 2003

(65) Prior Publication Data

US 2003/0160626 A1 Aug. 28, 2003

Related U.S. Application Data

(62) Division of application No. 09/540,870, filed on Mar. 31, 2000, now Pat. No. 6,563,330.

(30) Foreign Application Priority Data

Aug. 19, 1999 (JP) ............................................ 11-233109

(51) Int. Cl.$^7$ ......................... G01R 31/02; G01R 31/26
(52) U.S. Cl. ...................................... 324/754; 324/765
(58) Field of Search ................................. 324/754, 765, 324/755, 763, 761, 760; 438/106, 458

(56) References Cited

U.S. PATENT DOCUMENTS 5,983,492 A  11/1999  Fjelstad 6,263,566 B1 * 7/2001 Hembree et al. ............. 29/874

\* cited by examiner

Primary Examiner—Albert Decady
Assistant Examiner—James Kerveros
(74) Attorney, Agent, or Firm—Westerman, Hattori, Daniels & Adrian, LLP

(57) ABSTRACT

A probe card for testing a wafer having formed a plurality of semiconductor chips, the probe card including a board and a multi-layer substrate. The probe card may also include a flexible substrate. A contact electrode, located opposite from an electrode on one of the chips, is disposed above or below the flexible substrate, or may be provided on an elastic material on the multi-layered substrate. A first wiring has a first portion connected to the contact electrode, a level transitioning portion extending from a level of the first portion to the multi-layer substrate at a lower level, and a connecting terminal at an end of the level transitioning portion connected to an internal terminal on the multi-layered substrate. A second wiring in the multi-layered substrate connects the internal terminal to an external terminal at a periphery of the multi-layer substrate. A third wiring on the board connects the external terminal on the multi-layer substrate to an external connecting terminal on the board. Displacements of the internal terminal resulting from the temperature load applied during testing of the wafer are compensated by the level transitioning portion of the first wiring. Unevenness involved with the contact between the contact electrodes on the probe card and the electrodes on the chips are compensated by the contact electrodes and/or elastic material. An electrode pitch of the contact electrodes is expanded by the first wiring.

3 Claims, 18 Drawing Sheets

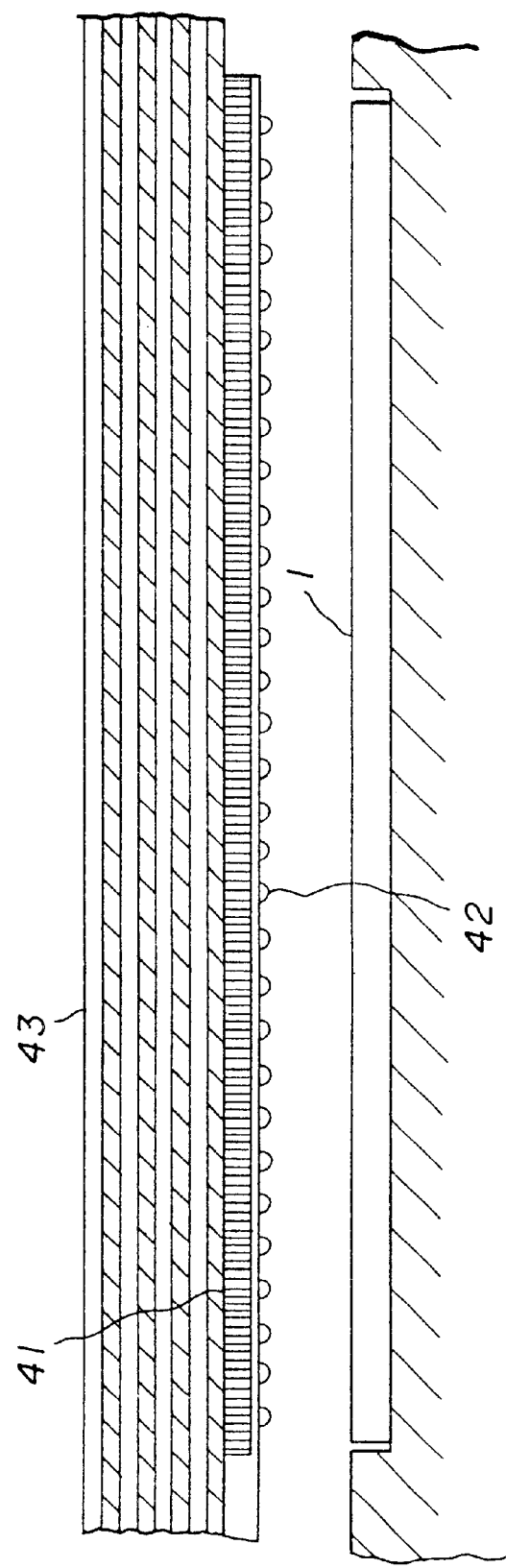

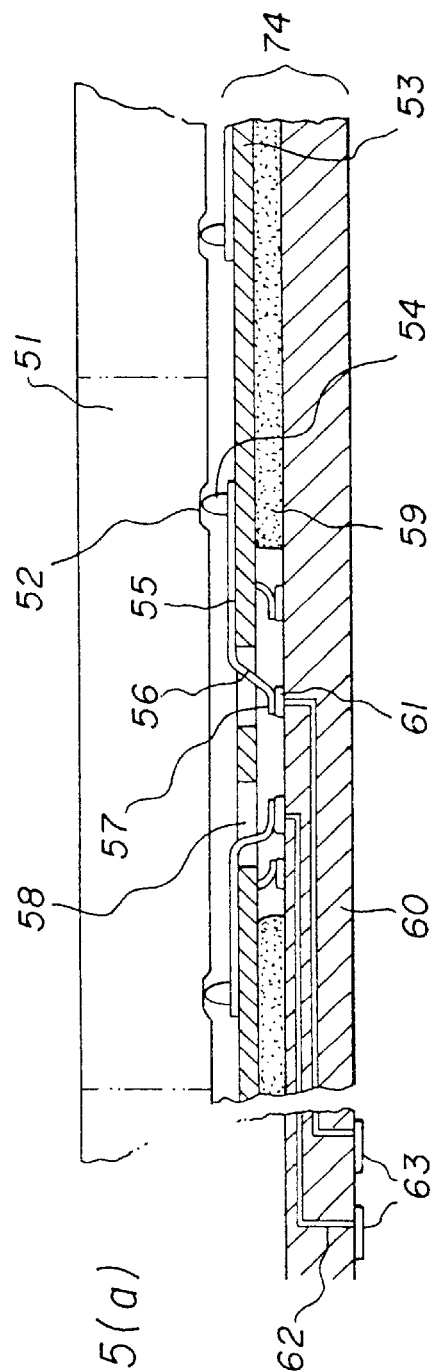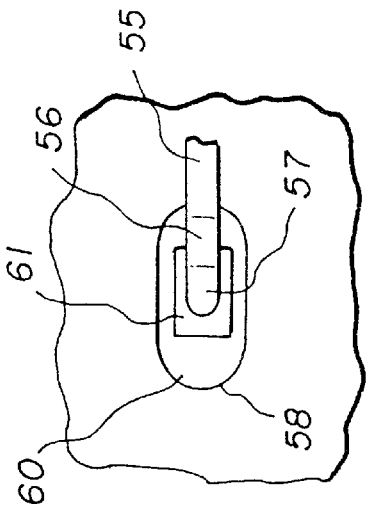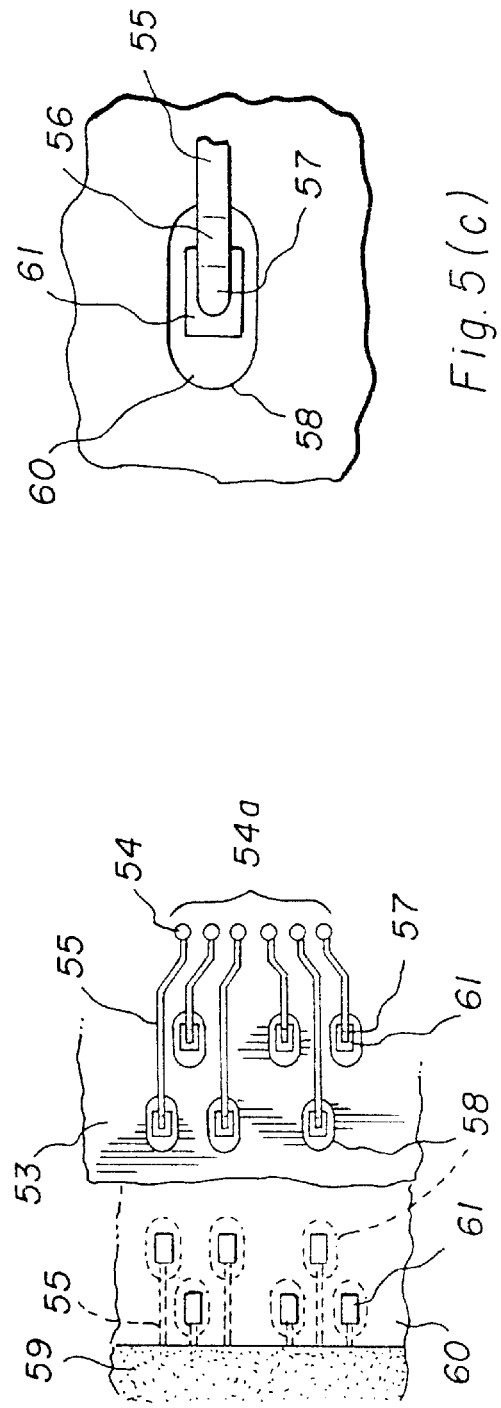

Fig. 10(a)
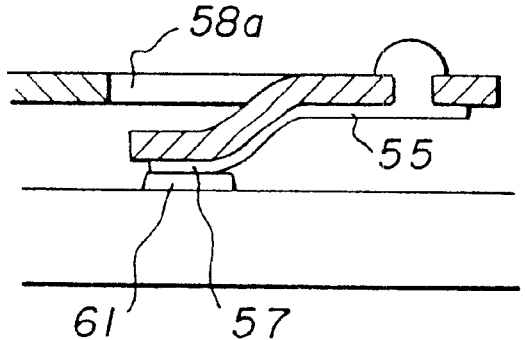
Fig. 10(b)
Fig. 11
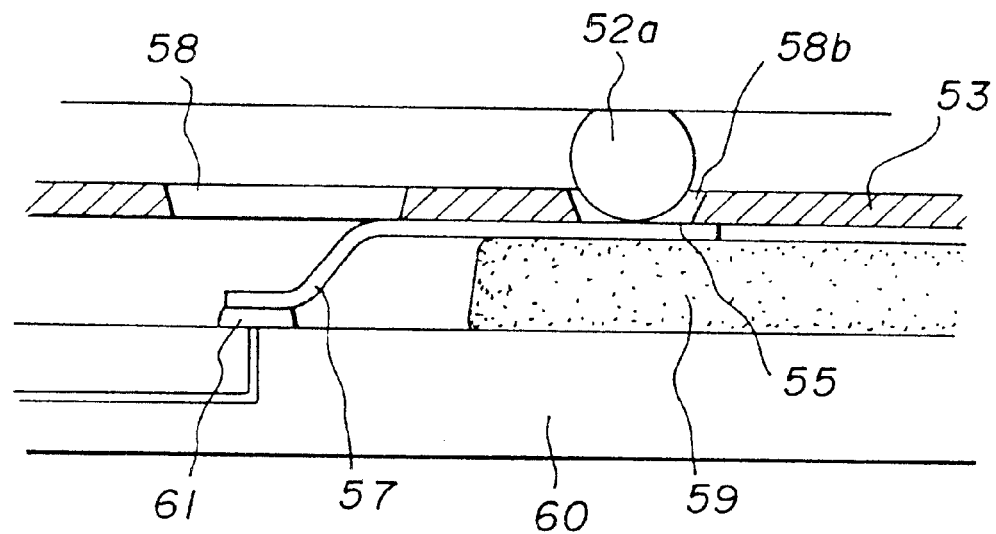

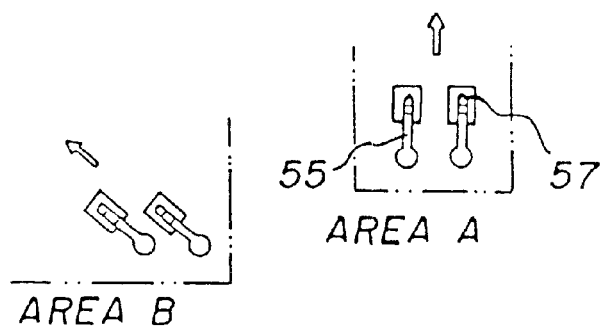
Fig. 20
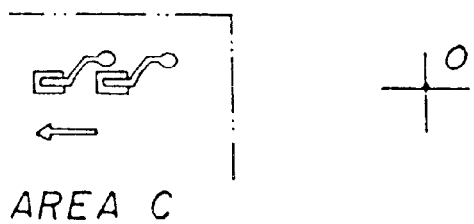
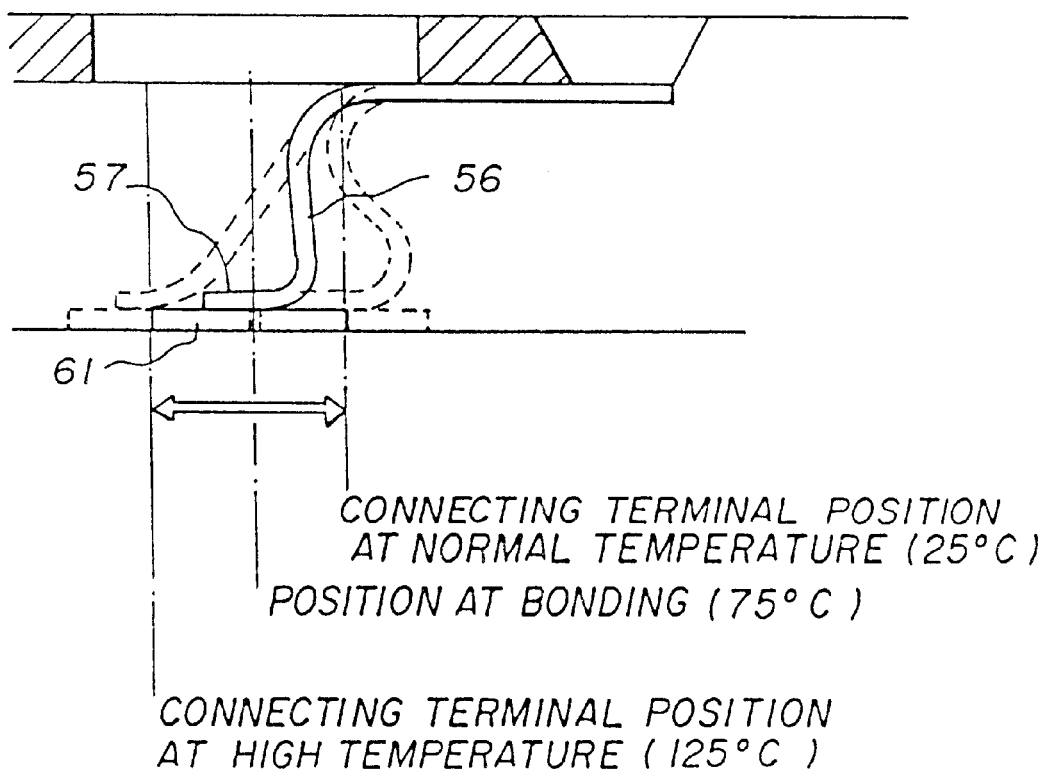
Fig. 21

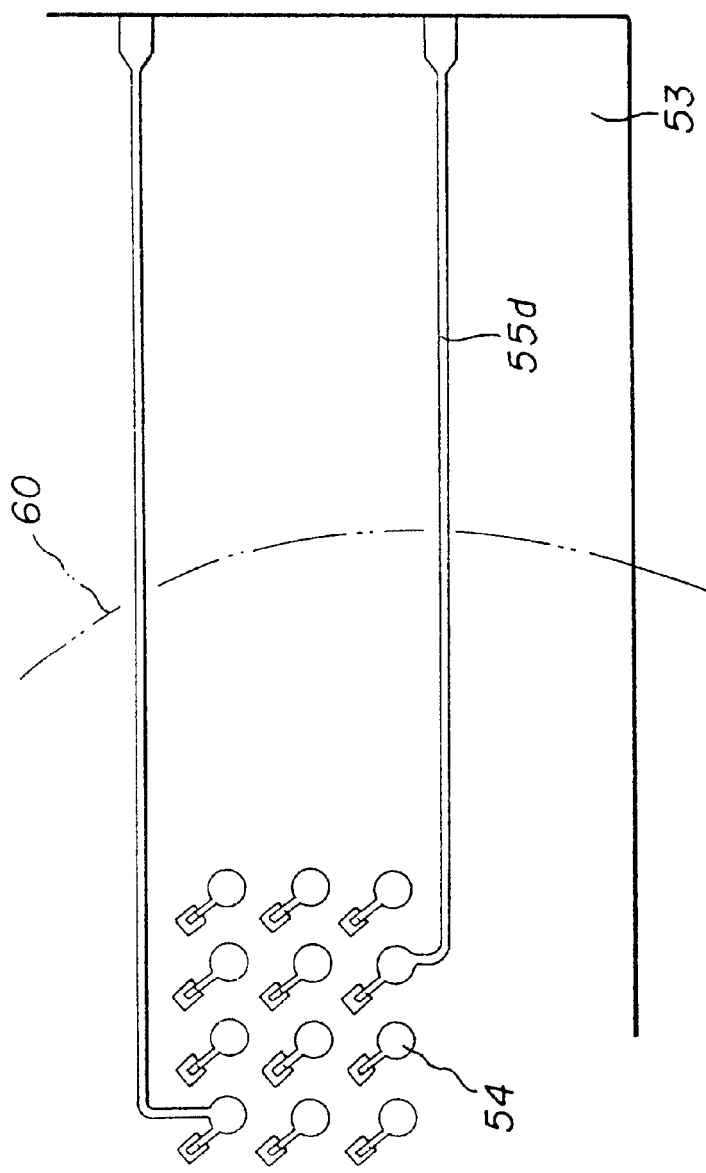
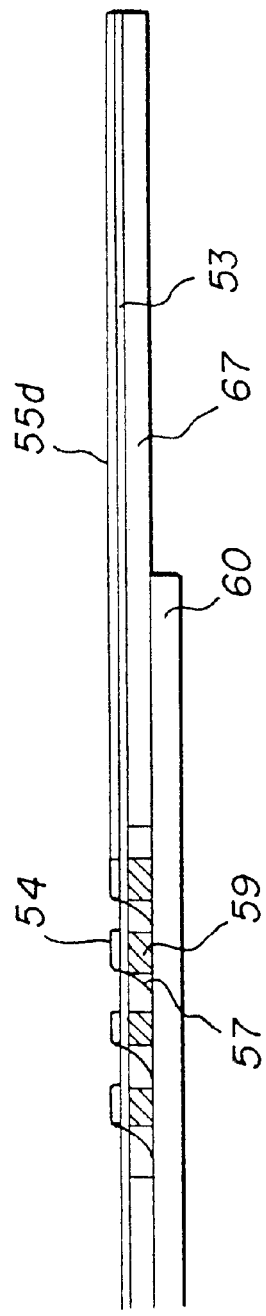
Fig.28(a)
Fig.28(b)

PROBE CARD AND METHOD OF TESTING WAFER HAVING A PLURALITY OF SEMICONDUCTOR DEVICES

This application is a DIVISION of prior application Ser. No. 09/540,870 filed Mar. 31, 2000 U.S. Pat. No. 6,563,330.

CROSS-REFERENCE TO RELATED APPLICATIONS

This application is based upon and claims priority of Japanese Patent Application No. 11-233109.

BACKGROUND OF THE INVENTION

The present invention relates to a probe card for simultaneous testing. More particularly, the present invention relates to a probe card for a wafer to test a plurality of chips and chip size packages (hereinafter referred to as CSP) formed on the wafer and a method of testing a semiconductor device such as the wafer level CSP or the like.

In order to form a semiconductor device sealed by resin having such a shape that is as close as possible to a semiconductor chip (hereinafter referred to as chip), applicant suggests a new semiconductor package having the structure that external output terminals formed by projecting electrodes are provided on the chip. At least the side surface of the projecting electrode is sealed by resin in the wafer condition and thereafter chips are cut into individual chips (refer to Japanese Published Unexamined Patent Application No. HEI 10-79362, and U.S. patent application Ser. No. 09/029,608).

More effective testing of the semiconductor device can be realized by conducting the testing when the CSPs are in the wafer condition, rather than conducting testing for individual CSPs cut from the wafer. The same can be said for testing wafers on which a plurality of ordinary chips are formed. The present invention relates to a probe card for testing each of a plurality of chips and CSPs in the wafer condition and a method of testing the wafer having a plurality of semiconductor devices.

FIGS. 1 to 4 are diagrams illustrating an example of a CSP of the related art. FIG. 1 is a cross-sectional view, while FIG. 2 illustrates the condition before CSPs like that of FIG. 1 were cut into individual pieces and FIG. 3 is a plan view of FIG. 2.

In the CSP illustrated in FIG. 1, an area other than aluminum pad 4 on a chip 1 is covered with a silicon nitride film 2 and a polyimide layer 3 is further formed thereon. An aluminum electrode pad 4 formed on the chip 1 has problems in that a probe cannot make contact with it at the time of testing because its interval is too narrow in the non-modified arrangement and the pad cannot be mounted on the mounting substrate at the time of mounting. Therefore, a re-distribution trace 5 is formed on the polyimide layer 3, connecting the aluminum pad 4 to a copper projecting electrode 6 at an appropriate position on the chip, thereby widening the interval of the aluminum pads 4. For the mounting on a printed board, solder-ball 8 is formed on the copper projecting electrode 6 via a barrier metal layer 7.

When manufacturing the CSP of FIG. 1, after the copper projecting electrode 6 is formed on the wafer, a resin layer 9 is formed to seal at least the side surface of the copper projecting electrode 6. Thereafter, solder balls 8 are formed and then the CSPs on the wafer are cut into individual pieces along the dicing line 12 as illustrated in FIG. 2.

However, at the time of testing the CSP, since testing efficiency is reduced after the solder balls 8 are divided into individual pieces, it is strongly desired to conduct the testing of the CSPs while they are still in the wafer condition before the cutting as illustrated in FIG. 3.

FIG. 3 illustrates the condition that the CSP is formed in the wafer condition and the wafer 11 is held by a tape 10. When a probe formed of an ordinary stylus is applied to the electrode pad (not illustrated) of each chip under this condition, a probe having a stylus corresponding to the interval of the narrow pad must be prepared, resulting in increased cost.

As a method not using a probe formed of a stylus, there is provided a method using anisotropic conductive rubber, as illustrated in FIG. 4. In this method, a flexible substrate 42 is provided on the anisotropic conductive rubber 41, which is pressed into contact with the wafer to be tested, and a signal on the electrode on the wafer is electrically guided to a multi-layer substrate 43.

However, the method using the anisotropic conductive rubber has the following problems. Since the anisotropic conductive rubber is used, the wiring cannot be led to a multi-layer substrate so as to widen the pitch of electrodes on the wafer. Therefore, wiring must be laid on the multi-layer substrate under the electrode pitch of the wafer without change in the pitch. Moreover, fluctuation of flatness which may be absorbed by the anisotropic conductive rubber is ranged from 25 to 50 $\mu$m and therefore an expensive ceramic substrate having excellent flatness is used as the multi-layer substrate. When the electrode pitch on the wafer is realized by the ceramics multi-layer substrate, through hole must be bored within a narrow pitch. Therefore, when a ceramics substrate is used for the multi-layer substrate, a probe card becomes expensive because such a substrate is originally expensive and processing cost is also high.

Here, when a low cost printed circuit board formed of glass epoxy or the like is used for the multi-layer substrate, strain of about 100 $\mu$m is generated at the contact area between the anisotropic conductive rubber and multi-layer substrate, which is not preferable for contact area stability.

Moreover, the anisotropic conductive rubber cannot cover the resolution when the electrode pitch of wafer becomes 100 $\mu$m or less.

Moreover, since the probe card is exposed to high temperatures in the burn-in test, the anisotropic conductive rubber can bear only 100 times of use, so its durability is also a problem.

BRIEF SUMMARY OF THE INVENTION

It is therefore an object of the present invention to provide a probe card and a method of testing a wafer having formed a plurality of semiconductor devices which always assure good contact with each chip and electrode pad of CSP without using multi-layer ceramics substrate and anisotropic conductive rubber at the time of testing chips and CSPs in the wafer condition.

It is a further object of the present invention to cover narrow electrode pitches.

It is a further object of the present invention to assure excellent durability under high temperatures.

Objects of the invention are achieved by a probe card including a board and a multi-layer substrate. The probe card may also include a flexible substrate. A contact electrode, located opposite from an electrode on one of the chips, is disposed above or below the flexible substrate, or may be provided on an elastic material on the multi-layered substrate. A first wiring has a first portion connected to the contact electrode, a level transitioning portion extending from a level of the first portion to the multi-layer substrate at a lower level, and a connecting terminal at an end of the level transitioning portion connected to an internal terminal on the multi-layered substrate. A second wiring in the multi-layered substrate connects the internal terminal to an external terminal at a periphery of the multi-layer substrate. A third wiring on the board connects the external terminal on the multi-layer substrate to an external connecting terminal on the board. An electrode pitch between connecting terminals is greater than an electrode pitch between contact electrodes.

Objects of the invention are also achieved by a method for forming a probe card, including the steps of forming contact electrodes aligned opposite from corresponding electrodes on the plurality of semiconductor devices; expanding an electrode pitch of the contact electrodes with first wirings; bending each of the first wirings to form a level transitioning portion extending from a level of the contact electrodes to a multi-layer substrate at a lower level; bonding connecting terminals at an end of the level transitioning portion of each of the first wirings to internal terminals on the multi-layer substrate; connecting the internal terminals on the multi-layer substrate to external terminals at a periphery of the multi-layer substrate with second wirings; and placing the multi-layer substrate on a board having third wirings connecting the external terminals on the multi-layer substrate to external connecting terminals on the board.

In the present invention described above, the probe card of the present invention places the electrode of each chip on the wafer and the contact electrode in contact and guides the contact electrode to the connecting terminal by the first wiring with an expanded pitch for the electrode. Accordingly, both elements can be connected without use of anisotropic conductive rubber. Since anisotropic conductive rubber is never used, the temperature load applied at the time of testing the wafer creates a stress to the joint of the connecting terminals due to the difference of thermal expansion coefficients between the flexible substrate and the multi-layer substrate. However, such stress can be compensated by the level transitioning portion of the first wiring extending between the flexible substrate and the multi-layer substrate.

When such stress is applied, the position of the internal terminal is deviated relative to the flexible substrate. Since the first wiring is projected like a beam lead as the level transitioning portion between the flexible substrate and the multi-layer substrate, and is free to move relative to the flexible substrate, even if the internal terminal is deviated, such positional deviation can be compensated by the elasticity in the level transitioning portion of the first wiring.

Moreover, since the anisotropic conductive rubber is never used, there is no portion which may be deteriorated by the temperature load of the burn-in test, and thereby enhancing the durability of the probe card.

Moreover, since the electrode of the chip is connected to the internal terminal on the multi-layer substrate after the electrode pitch is expanded by the first wiring on the flexible substrate, fabrication accuracy of the multi-layer substrate may be rather low, and thereby the fabrication cost for the multi-layer substrate can be reduced. In addition, the flatness obtained for the multi-layer substrate may be about 50 $\mu$m because fluctuation in the height direction of the part where the internal terminal is formed may be compensated by the elasticity of the level transitioning area of the first wiring. The multi-layer substrate may be structured by a printed circuit board formed of a low price glass epoxy or the like, without use of an expensive ceramics substrate from the viewpoint of fabrication accuracy and flatness.

Objects of the invention are further achieved by a method testing a wafer having a plurality of semiconductor devices, including the steps of contacting an electrode on one of the plurality of semiconductor devices with a contact electrode on a probe card; and supplying a test signal to an external connecting terminal on a board of the probe card, through a wiring connecting the external connecting terminal to an external terminal on a periphery of a multi-layer substrate of the probe card, through a wiring connecting the external terminal to an internal terminal on the multi-layer substrate, and through a wiring having a level transitioning portion extending from the internal terminal at a level of the multi-layer substrate and connecting to the contact electrode at a higher level.

In the present invention described above, the method of testing the wafer having a plurality of semiconductor devices is capable of conducting highly reliable testing of the wafer without losing the joint between the connecting terminal and internal terminal because stress from the temperature load can be compensated by the elasticity of the level transitioning portion as explained above. Particularly, the larger the wafer size becomes, the larger the stress becomes, but testing can be done without stress-induced problems using the probe card of the present invention.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 4 is a diagram illustrating the related art using anisotropic conductive rubber;

FIG. 5(*a*) is a cross-sectional view and FIGS. 5(*b*) and 5(*c*) are plan views of the first embodiment of the present invention;

FIGS. 10(*a*) and 10(*b*) are diagrams illustrating a modification of the first embodiment of the present invention;

FIG. 11 is a diagram illustrating a modification of the first embodiment of the present invention;

FIG. 20 is a diagram illustrating a modification of the second embodiment of the present invention;

FIG. 21 is a diagram illustrating a modification of the second embodiment of the present invention;

FIG. 28 is a diagram illustrating a modification of the sixth embodiment of the present invention.

DETAILED DESCRIPTION OF THE PREFERRED EMBODIMENTS

Figure 1:
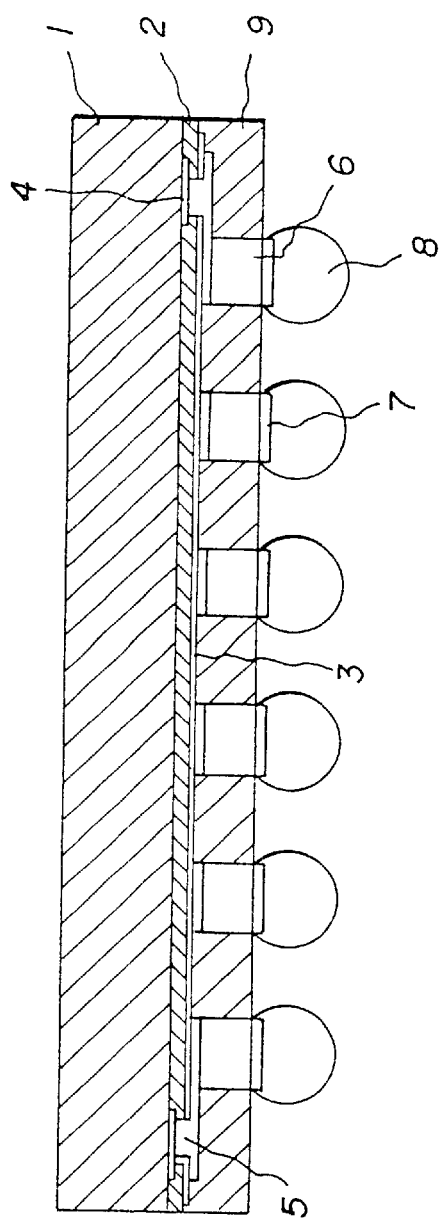
FIG. 1 is a diagram explaining a CSP which is a test object of the present invention.

Reference will now be made in detail to the preferred embodiments of the present invention, examples of which are illustrated in the accompanying drawing, wherein like reference numerals refer to like elements throughout.

Although a few preferred embodiments of the present invention have been shown and described, it will be appreciated by those skilled in the art that changes may be made in these embodiments without departing from the principles and spirit of the invention, the scope of which is defined in the claims and their equivalents.

The preferred embodiment of the probe card and the method of testing wafer having a plurality of semiconductor devices of the present invention will be explained with reference to FIGS. 5 to 28.

In the case of a semiconductor wafer, electronic circuits are formed by the well known wafer process on a plurality of chips at the surface thereof but the burn-in test and function test are required before delivery of such semiconductor wafer. In order to conduct these tests before the wafer is respectively divided into each chip, a certain means is required for connecting respective electrodes of each chip formed on the wafer. Such means is realized by a probe card having mounted the wafer contactor formed by the flexible substrate and multi-layer substrate on a board in this embodiment.

In this embodiment of the present invention, a burn-in board will be explained as an example of the probe card. Moreover, in this embodiment, as the wafer to be tested, a bare wafer and a wafer where CSPs are formed in the wafer condition are considered as the object. These elements are explained as the wafer in the following explanation.

(First Embodiment)

FIGS. 5 to 16 are diagrams for explaining the first embodiment of the present invention. FIG. 5(a) is a cross-sectional view of a wafer 51 and a wafer contactor 74 of the first embodiment. FIG. 5(b) is a diagram illustrating a plan view of the wafer contactor 74 facing the wafer 51. FIG. 5(c) is a partially enlarged diagram of a joining part illustrated in FIG. 5(b).

In these figures, 51 designates a semiconductor wafer where a plurality of CSPs or ordinary chips are formed. The CSP or chip (hereinafter referred to as chip) formed on this wafer 51 has an electrode 52 and a projecting electrode such as bump is never formed on the electrode 52 in an example of FIG. 5. After completion of the testing, a bump or the like is formed thereon and wafer is cut to individual chips, such bumps may be used as external terminals to be mounted on the mounting substrate.

53 designates a flexible substrate having the contact electrode 54 for electrical connection with the electrode 52 of each chip. The substrate 53 is formed of polyimide or silicon rubber or the like. The flexible substrate 53 has thickness of 25 to 50 $\mu$m and a thermal expansion coefficient of 10 to 1000. The substrate 53 is required to have a certain flexibility when a stress is applied to. Size of the flexible substrate 53 is determined depending on the size of wafer to be tested but is set to about 250 to 500 mm×250 to 500 mm when the wafer is an 8-inch size wafer.

As illustrated in FIG. 5(b), the contact electrode 54 is a projecting electrode formed of Cu, Ni or the like corresponding to the layout of the electrode 52 of each chip on the wafer 51. In this example, the electrode group 54a is structured with a 100 $\mu$m pitch. Each contact electrode 54 is guided by a wiring 55 to an aperture 58 provided on the flexible substrate 53 for connection to the internal terminal 61 on the multi-layer substrate 60 via the connecting terminal 57 located at an end part of the wiring 55. The internal terminal 61 is formed of Cu and its surface layer is plated by Au. The terminal pitch is expanded, in this example, by about 500 $\mu$m. The aperture 58 is provided at the flexible substrate 53 to expose the internal terminal 61.

The multi-layer substrate 60 is provided under the flexible substrate 53 and is structured by the laminated printed circuit board formed of glass epoxy, epoxy resin including alamid fiber, FR-4, FR-5, Ni-clad molybdenum, Cu-clad Imvar substrate or the like. An elastic material 59 formed of rubber or the like is provided between the flexible substrate 53 and the multi-layer substrate 60. This elastic material is not required to be conductive and therefore silicon rubber or gel or the like may be used. The aperture 58 is provided in the flexible substrate 53 over a vacant area between the flexible substrate 53 and the multi-layer substrate 60 not filled with the elastic material 59 adjacent the electrode group 54a. The wiring 55 is formed with an adequate pattern by etching the Cu film, and the uppermost surface layer is plated by Au. The internal terminal 61 is guided to an external terminal 63 provided at a periphery of the multi-layer substrate 60 by a wiring layer 62 disposed within the multi-layer substrate 60.

A pitch of the external terminal 63 is identical to that of the internal terminal 61 or is much more expanded. The external terminal 63 is connected to the wiring on the burn-in board. It is desirable that the number of external terminals be small. Some input terminals and address terminals connected to the burn-in test apparatus are used in common in each chip. Therefore, the number of external terminals may be reduced by extending the wiring in the internal wiring layer 62 from a common external terminal to each chip.

FIG. 5(c) illustrates an expanded view of a joining portion between the connecting terminal 57 and internal terminal 61. The wiring 55 on the flexible substrate 53 is bent to form a level transitioning portion 56 extending below the flexible substrate 53 to the multi-layer substrate 60 to allow the connecting terminal 57 to be connected to the internal terminal 61 at the lower level. This joining may be done by bonding with pressure to wiring and terminal by a bonding head such as the single point bonder or wire bonder or the like. Therefore, the size of the aperture 58 must allow the entry of bonding head. Pressure bonding method may be done by using thermal bonding or ultrasonic bonding or by the thermal bonding after solder plating of the connecting terminal 57 or internal terminal 61.

Figure 6:
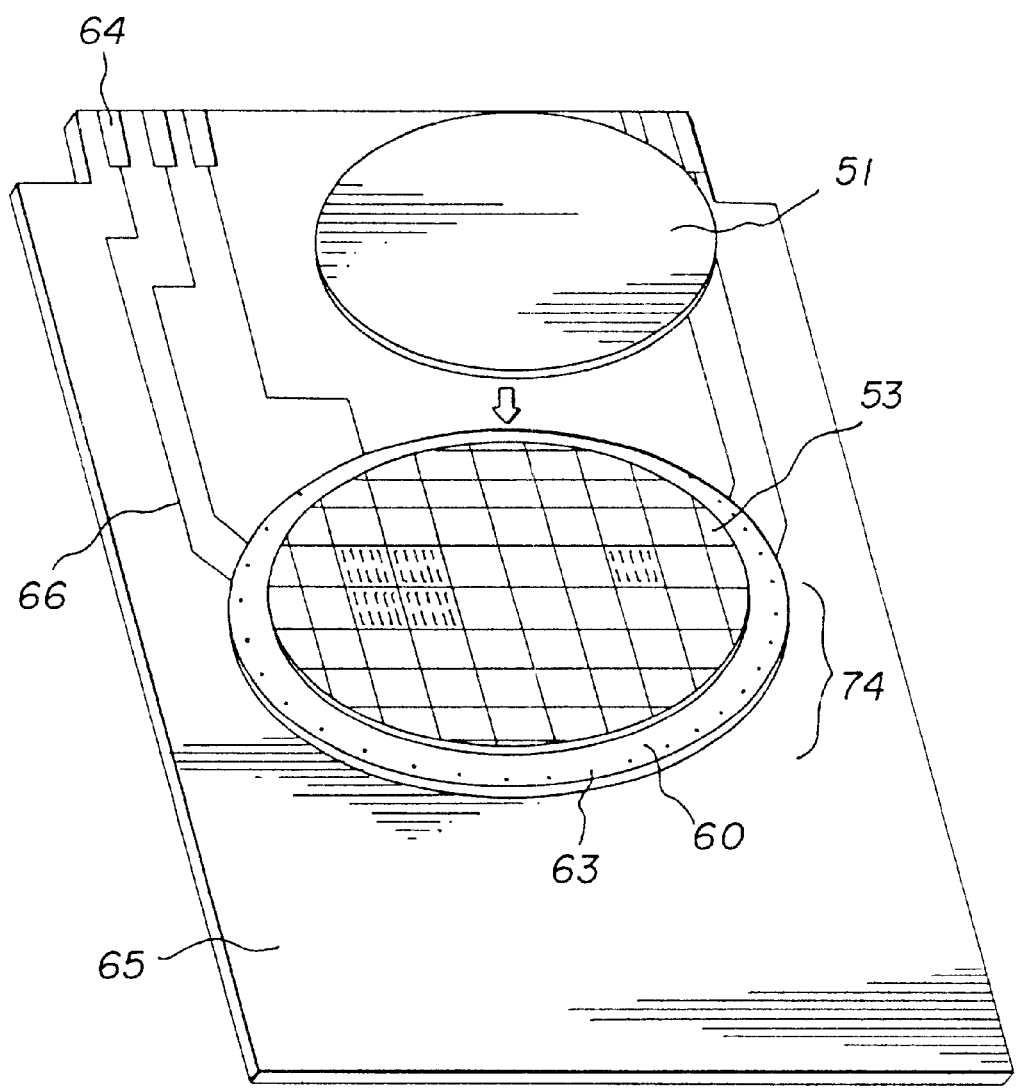
FIG. 6 is a perspective view of a probe card of the present invention.

FIG. 6 is a diagram illustrating the condition that the wafer contactor 74 structured by the flexible substrate 53 and multi-layer substrate 60 as explained in FIG. 5 is mounted to a burn-in board 65.

The multi-layer substrate 60 is fixed to a predetermined position on the burn-in board 65. The external terminal 63 is connected to a terminal (not illustrated) on the burn-in board and is then extended by the wiring 66 to the external connecting terminal 64 provided at the end of the burn-in board 65. The external connecting terminal 64 is used as a card edge connector. Connection with the test apparatus is made via this card edge connector. For the burn-in test of the wafer 51, the electrode 52 of each chip on the wafer is positioned over and pressed into contact with the contact electrode 54 on the flexible substrate 53. Testing is conducted under the temperature cycle of normal temperature and 125° C. or under the constant temperature of 125° C. In general, the burn-in test may be conducted by applying the temperature cycle load or by applying a constant load under a high temperature of 125° C. In the following explanation, the load applied in this case is generally called a temperature load.

The wafer test conducted using the probe card structured as explained above provides the following effects.

In this embodiment, since electrode 52 of each chip of wafer 51 is placed in contact with the contact electrode 54 and the electrode group 54a is guided to the connecting terminal 57 by the wiring 55 through expansion of pitch thereof, these elements can be connected without use of anisotropic conductive rubber. Since anisotropic conductive rubber is not used, stress is created, by the temperature load at the time of testing the wafer 51, at the coupling area illustrated in FIG. 5(c). Such stress results from a difference of thermal expansion coefficients between the wafer 51 and the multi-layer substrate 60 (thermal expansion coefficient of wafer: 3 ppm, thermal expansion coefficient of multi-layer substrate-glass epoxy: 13 to 20 ppm, epoxy resin including alamid fiber: 10 ppm, and in the case of Ni-clad molybdenum: 5 to 6 ppm). However, in this embodiment, such stress can be absorbed by the level transitioning portion 56 of the wiring 55.

Figure 7:
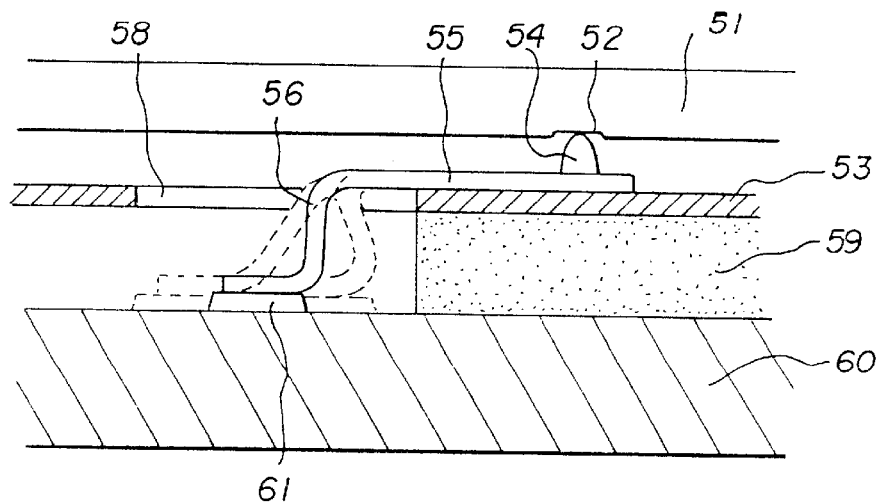
FIG. 7 is a diagram for explaining an operation of the present invention.

FIG. 7 illustrates how stress is compensated during application of the temperature load at the time of testing. Due to stress generated due to a difference in thermal expansion coefficients between the multi-layer substrate 60 and wafer 51, strain is generated on the wiring 55 as indicated by a dotted line. Although stress is also generated due to the difference in thermal expansion coefficients of the flexible substrate 53 and multi-layer substrate 60, the flexible substrate 53 is rigidly placed in contact with the wafer 51 so that stress is almost thought to be generated due to difference in thermal expansion coefficients between the multi-layer substrate 60 and wafer 51. In other words, stress generated between the flexible substrate 53 and multi-layer substrate 60 may be thought to be identical to the stress generated between the wafer 51 and multi-layer substrate 60. If positional deviation between the flexible substrate 53 and wafer 51 cannot be neglected, it is enough that the contact electrode 54 on the flexible substrate 53 be formed long in the radial shape for the center of the flexible substrate 53.

When stress is applied between the flexible substrate 53 and multi-layer substrate 60, the position of internal terminal 61 is deviated relative to the flexible substrate 53. The wiring 55 is projected through the aperture 58 in the form of a beam lead and is free to move relative to the flexible substrate 53 and multi-layer substrate 60. If the position of internal terminal 61 is deviated, such movement can be absorbed by elasticity of the level transitioning portion 56 of the wiring 55 as indicated by the dotted line.

If it is impossible to provide a sufficient length of the level transitioning portion 56, the deforming range of the level transitioning portion 56 may be made narrower when the epoxy resin including alamid fiber (thermal expansion coefficient: 10 ppm), copper-clad Invar substrate (thermal expansion coefficient: 1.0 to 5.5 ppm), Ni-clad molybdenum (thermal expansion coefficient: 5.2 to 6.0) is used as the flexible substrate. Therefore, deterioration of the level transitioning portion 56 and the coupling area is never easily generated.

Moreover, since anisotropic conductive rubber is never used, there is no part to be deteriorated due to the temperature load during the testing, and therefore, durability of the probe card can be enhanced.

Moreover, in this embodiment, since the electrode 52 on the chip is connected to the internal terminal 61 on the multi-layer substrate after the pitch of the contact electrode 54 is expanded by the wiring 55 on the flexible substrate 53, the fabrication accuracy of the multi-layer substrate 60 may be rather low and the processing cost can be kept low. In addition, it is enough that the flatness required for multi-layer substrate is 60 be about 50 $\mu$m because fluctuation in the height direction of the part where the internal terminal 61 is formed can be absorbed by elasticity of the level transitioning portion 56 of the wiring 55. The multi-layer substrate 60 can be a printed circuit board formed of a low price glass epoxy or the like without use of expensive ceramics from the point of view of fabrication accuracy and flatness.

Moreover, since an elastic material 59 is provided between the flexible substrate 53 and multi-layer substrate 60, fluctuation in the height of the electrode 52 on the chip can be compensated.

Moreover, since the burn-in board 65 may include a plurality of laminated substrates and wiring may also be provided within the inside of the laminated substrates in addition to the surface of board, the number of external terminals of multi-layer substrate can be increased. The wiring provided inside the laminated substrates is led to the surface via a via-hole at the area near the external connecting terminal 63 and is then connected to the external connecting terminal 63.

When it is allowed from the viewpoint of cost, the multi-layer substrate of this embodiment can be formed of the ceramics substrate.

The process for conducting, under the chip condition, the test of each chip (each CSP in the case of wafer level CSPs) formed on the wafer will be explained below.

First, a probe card is prepared by loading the wafer contactor 74 onto the burn-in board 65 as shown in FIG. 6.

Next, positioning is conducted between the electrode 52 on the chip and the contact electrode 54, and the wafer 51 to be tested (after completion of the wafer fabrication process) is laid on the burn-in board 65 as illustrated in FIG. 6.

Next, the wafer 51 and flexible substrate 53 are placed in close contact with a negative pressure by an evacuation process or the like.

Next, the external connecting terminal 64 is connected to a burn-in test apparatus and a test signal is supplied via the wiring 66 on the burn-in board 65 to test each chip on the wafer 51. In this case, for the burn-in test, the wafer 51 is kept within a high temperature and humidity condition.

In this case, when the temperature load is applied at the time of wafer testing, stress can be compensated by the effect of the level transitioning portion 56 of the wiring 55 as explained above, and the signal of the electrode 52 of each chip can be reliably guided to the internal terminal 61 on the multi-layer substrate. Moreover, this signal at the internal terminal 61 is guided to the external terminal 63 via the internal wiring layer 62 of the multi-layer substrate 60. The external terminal 63 provided at the end part of the flexible substrate 53 is connected to the wiring 66 on the burn-in board 65 as illustrated in FIG. 6 and is then guided to the external connecting terminal 64 at the end part of the burn-in board 65. The external connecting terminal 64 formed wide at the end part becomes the connector, and is then connected to the burn-in test apparatus to conduct the test of each chip on the wafer.

Moreover, since the electrode 52 of the chip being in contact with the contact electrode 54 is located on the elastic material 59, fluctuation in the height direction of electrode 52 on the chip can be compensated and poor contact is never generated.

A modified example of the first embodiment of the present invention will be explained.

Figure 8:
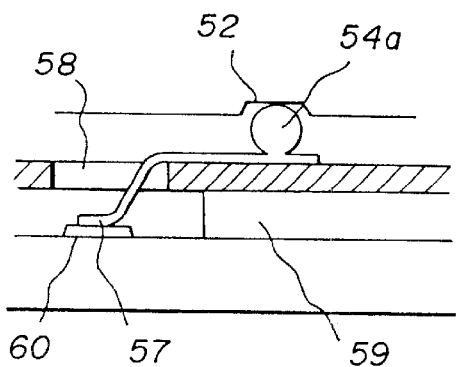
FIG. 8 is a diagram illustrating a modification of the first embodiment of the present invention.

FIG. 8 illustrates the contact electrode 54 being formed by a Ni-plated laminated layer bump or by a ball type bump 54a produced by a metal ball bonding. A contact condition can be easily attained even for a flat pad or a recessed pad (e.g. made of aluminum) constituting the chip electrode 52 by using such a bump 54a.

Figure 9:
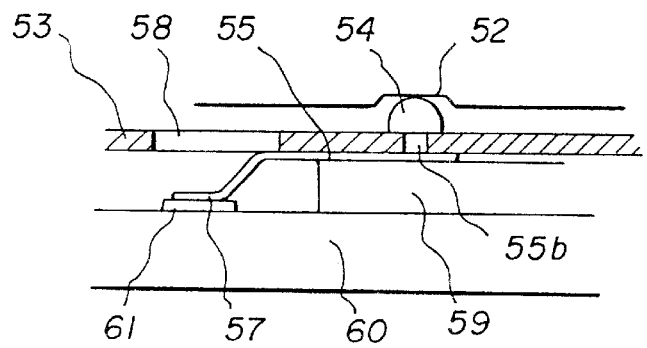
FIG. 9 is a diagram illustrating a modification of the first embodiment of the present invention.

FIG. 9 illustrates the wiring 55 formed underneath the flexible substrate 53. The contact electrode 54 is formed by causing Cu to grow with the plating via the through hole 55b provided in the flexible substrate 53 and then connecting it to the wiring 55. Short circuit between chip circuit surface and wiring 55 can be prevented by arranging the wiring 55 underneath the flexible substrate 53. In addition, since the level transitioning portions 56 becomes smaller in this arrangement, allowance is created in the length of this part, and thereby, elasticity of the level transitioning portion 56 can be enhanced.

In the case where the wiring 55 is provided underneath the flexible substrate 53, the wiring 55 does not pass through a window 58. But, since the window 58 is provided, movement of the level transitioning portion 56 is never prevented by the flexible substrate 53. Moreover, the pressure bonding energy for coupling the connecting terminal 57 to the internal terminal 61 can be applied directly.

FIGS. 10(a) and 10(b) illustrate an aperture formed by a cut-in portion 58a. The connecting terminal 57 at the end of the wiring 55 is formed on the under-side of the cut-in portion 58a. When the connecting terminal 57 is bonded to the internal terminal 61, the under-side of the cut-in portion 58a contacting the upper-side of the connecting terminal 57 is pressurized with a bonding head. Thereby, the cut-in portion 58a is pushed together with the wiring 55 to form the aperture and simultaneously couple the connecting terminal 57 with the inner terminal 61. By providing such a cut-in portion 58b, formation of the aperture and coupling between the connecting terminal 57 and internal terminal 61 can be realized simultaneously.

FIG. 11 illustrates a contact condition between the wafer 51 and the flexible substrate 53 when a bump 52a is provided on the electrode of each chip on the wafer 51. Since the bump 52a is provided to the chip to facilitate testing, a projected contact electrode on the flexible substrate 53 is not needed. Contact with the bump 52a can be realized by exposing the wiring 55 underneath the flexible substrate 53 through an aperture 58b provided in the flexible substrate 53, and then placing in contact the bump 52a and the wiring 55 in this area. The wafer, in which a projected electrode such as the bump 52a is provided on the chip, can be tested through the contact between the bump 52a and the wiring 55 exposed through the aperture 58b provided in the flexible substrate 53 as explained above.

Moreover, in the case of the wafer where a bump is never provided and only a land is formed, the wafer of such a type with the land can also be tested by forming the wiring 55 of FIG. 11 at the upper side of the flexible substrate 53 and then placing in direct contact this wiring 55 and the land. The land is structured by forming a Cu layer in a predetermined height by a plating method on the electrode pad of chip.

Figure 12A:
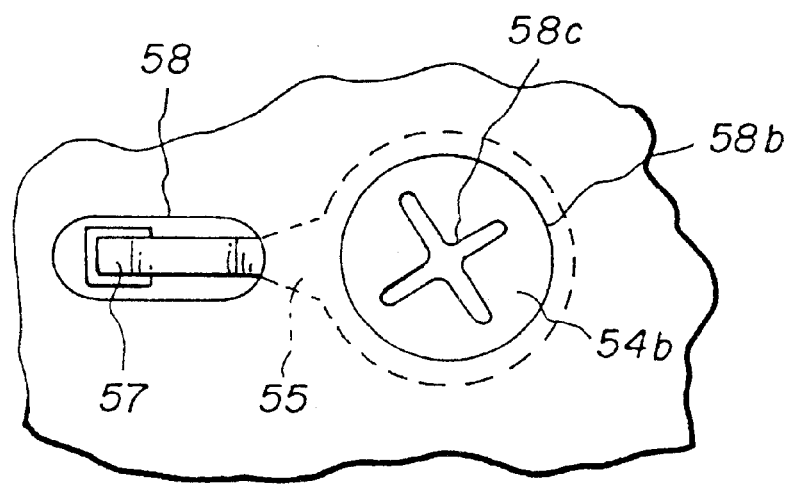
FIGS. 12(*a*) and 12(*b*) are diagrams illustrating a modification of the first embodiment of the present invention.
Figure 12B:
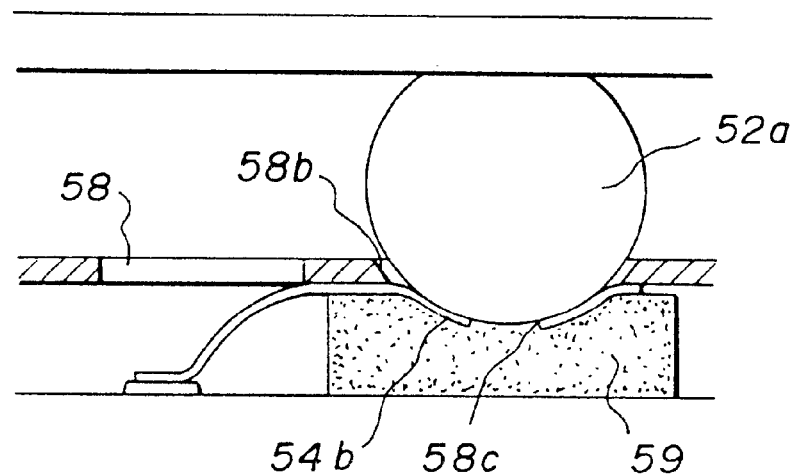

FIGS. 12(a) and 12(b) illustrate the arrangement of FIG. 11 modified with a contact electrode 54b having elasticity exposed through the aperture 58b. The contact electrode 54 of FIGS. 12(a) and 12(b) has a cut-in portion 58c provided in the shape of a cross for contact with the bump 52a of the chip. With the cut-in portion 58c, the contact electrode 54b has elasticity to compensate for any fluctuation in the height of the bump 52a. The shape of the cut-in portion 58c is set to give elasticity to the contact electrode 54b and is not limited to the shape of a cross. Moreover, further elasticity of the contact electrode 54b can be attained by providing an elastic material 59 underneath the contact electrode 54b.

Figure 13A:
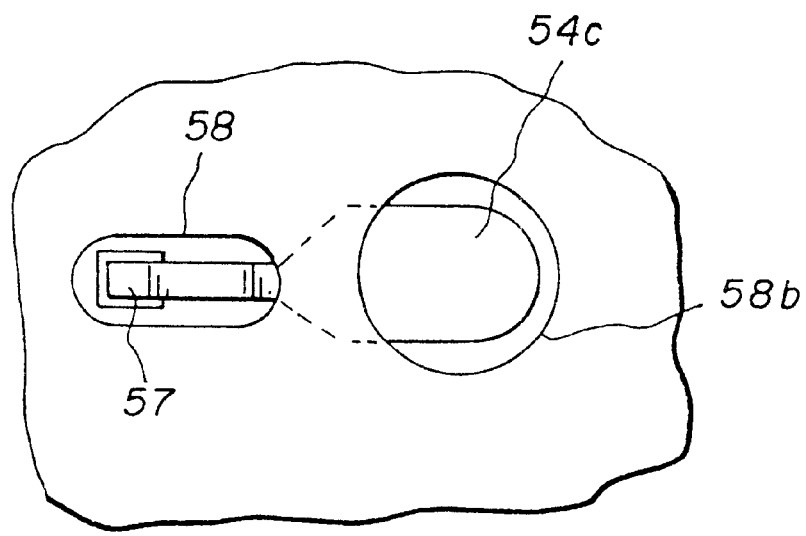
FIGS. 13(*a*) and 13(*b*) are diagrams illustrating a modification of the first embodiment of the present invention.
Figure 13B:
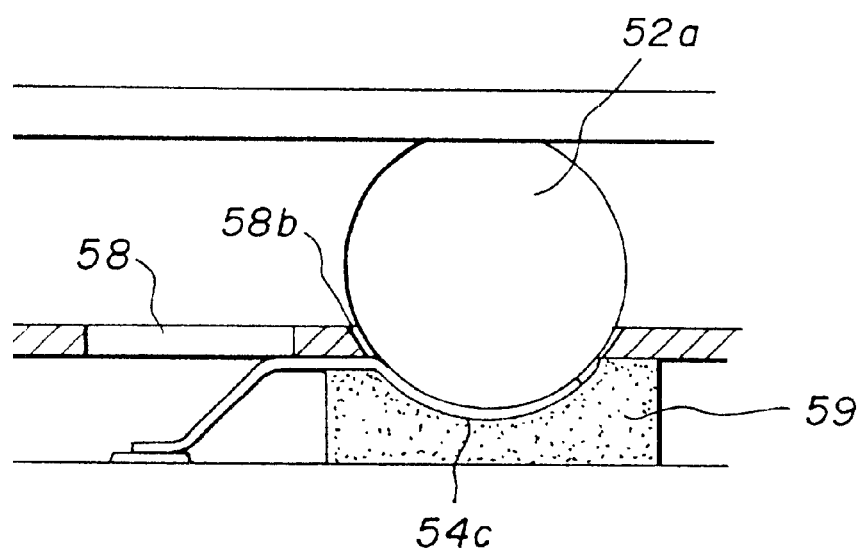

FIGS. 13(a) and 13(b) illustrate a modification of the arrangement of FIGS. 12(a) and 12(b) in providing the elasticity to the contact electrode 54. In the example of FIG. 12, the cut-in portion 58c provides the elasticity, but in this embodiment, a contact electrode 54c has elasticity by projecting into the aperture 58. When an elastic material 59 is provided underneath the contact electrode 54c, elasticity of the contact electrode 54c can be further improved.

When the electrode of the chip on the wafer is a flat electrode, the projected electrode 54c is used and is given elasticity by providing the cut-in portion 58b in the flexible substrate 53 around a circumference of the projected electrode 54c.

Figure 14:
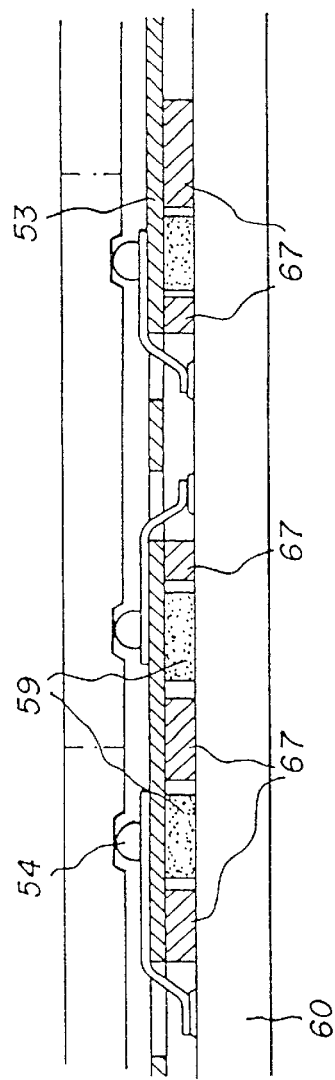
FIG. 14 is a diagram illustrating a modification of the first embodiment of the present invention.

FIG. 14 illustrates a spacer 67 provided between the flexible substrate 53 and the multi-layer substrate 60. When the wafer 51 is pushed toward the flexible substrate 53, an uneven surface is created on the flexible substrate 53 at the positions where the contact electrode 54 is provided and not provided. But, since the spacer 67 is provided to the part where elastic material 59 is not provided, distance between the flexible substrate 53 and the multi-layer substrate 60 can be kept constant and the degree of unevenness of the surface of the flexible substrate 53 can be minimized. The spacer 67 may be structured by a metal material, such as SUS and steel or the like, or by resin, such as glass epoxy or the like.

Figure 15:
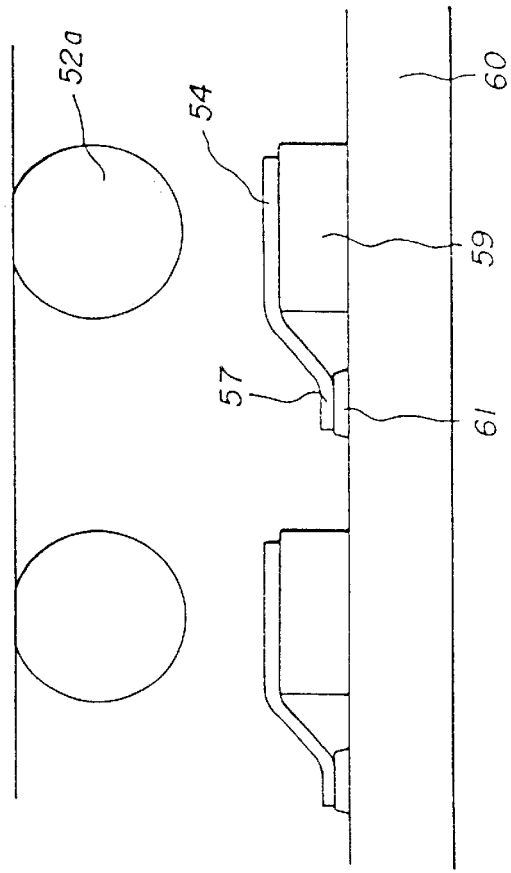
FIG. 15 is a diagram illustrating a modification of the first embodiment of the present invention.

FIG. 15 illustrates a profile where the flexible substrate 53 is removed after the connecting terminal 57 is coupled with the internal terminal 61 on the multi-layer substrate 60. Since the flexible substrate 53 is removed, only the contact electrode 54 is formed on the multi-layer substrate 60 via the elastic material 59 and the bump 52a on the wafer can be tested under the condition that it is placed in contact with the contact electrode 54.

Since the flexible substrate 53 is not used, it is no longer required to consider the difference of thermal expansion coefficients between the flexible substrate 53 and the multi-layer substrate 60.

After the contact electrode 54 is formed on the flexible substrate 53, this flexible substrate 53 can be removed by fixing the elastic material 59 on the contact electrode 54, then coupling the connecting terminal 57 and internal terminal 61 and then peeling off the substrate 53.

FIGS. 16(a) to 16(d) illustrate a process for conducting electrolytic plating on the connecting terminal 57. When Au plating is applied to the connecting terminal, the coupling property between the connecting terminal 57 and internal terminal 61 may be improved and it is desirable that such plating is made thick to a certain degree by the electrolytic plating method. However, the wiring for power supply must be extended to the area where the plating is required, in order to conduct such electrolytic plating. However, if such wiring is left up to the final step, electrical short-circuit occurs at all areas where the electrolytic plating has been conducted. Therefore, as a modification, the wiring for power supply is cut simultaneously with the bonding of the connecting terminal area by applying a modified version of the method used for FIG. 10, as explained below.

Figure 16A:
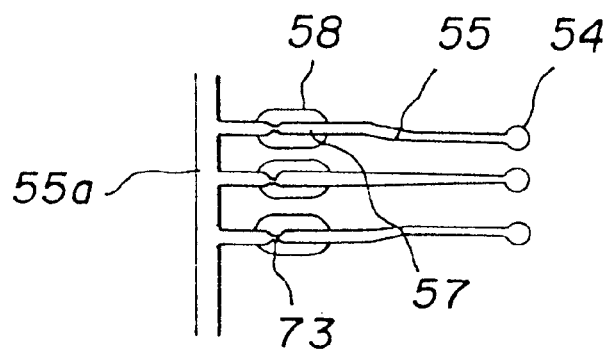
FIGS. 16(a) to 16(d) are diagrams illustrating a modification of the first embodiment of the present invention.

First, as illustrated in the plan view of FIG. 16(a), the portions which will become the contact electrode 54, wiring 55 and connecting terminal 57 are formed of Cu on the flexible substrate and these are connected with a wiring 55a for power supply formed of Cu foil. A narrow area 73 is provided between the wiring 55a for power supply and the connecting terminal 57. This narrow area 73 and the connecting terminal 57 are positioned over the aperture 58, as shown in cross-sectional view of FIG. 16(b). Here, it is also possible to provide the cut-in portion 58a like that of FIG. 10 without providing the aperture 58. The electrolytic plating is conducted to the connecting terminal 57 via the power supply wiring 55a to form the Au layer. In this case, the electrolytic plating may be conducted selectively to the connecting terminal and to the entire part of wiring.

Figure 16B:
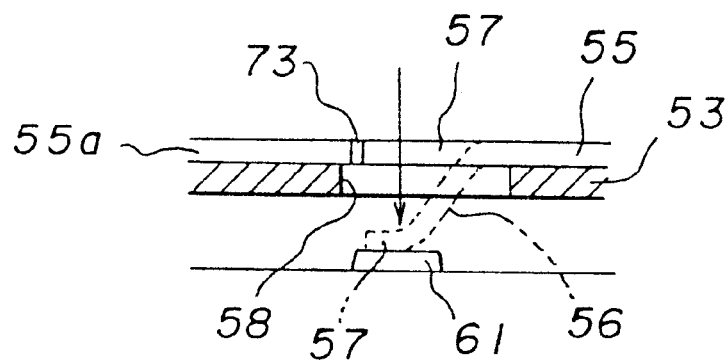
Figure 16C:
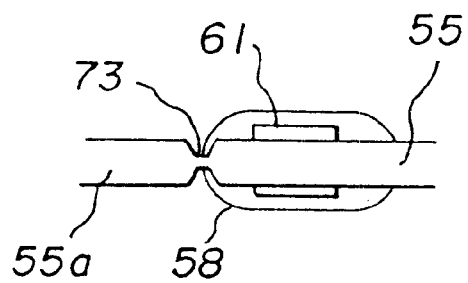
Figure 16D:
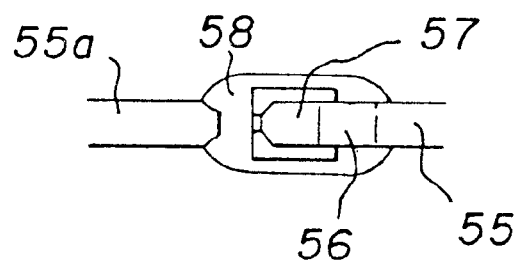

Next, as illustrated in FIG. 16(b), pressure is applied from the upper direction to a part of the connecting terminal 57 with a bonding tool for the connection with the internal terminal 61. In this case, the narrow area 73 is cut by the shock of bonding and thereby the power supply wiring 55a is cut from the connecting terminal 57. Simultaneously, the connecting terminal 57 is connected to the internal terminal 61. FIG. 16(c) is an enlarged plan view of the condition before the narrow area 73 is cut, while FIG. 16(d) is an enlarged plan view after the cutting.

With the process explained above, the Au plated layer can be formed in the necessary thickness by the electrolytic plating on the connecting terminal 57 and the cutting of power supply wiring 55a and coupling between the connecting terminal 57 and internal terminal 61 can be done simultaneously.

(Second Embodiment; Variation of Compensation for Thermal Stress)

FIG. 17 to FIG. 22 are diagrams illustrating the second embodiment of the present invention.

Figure 17:
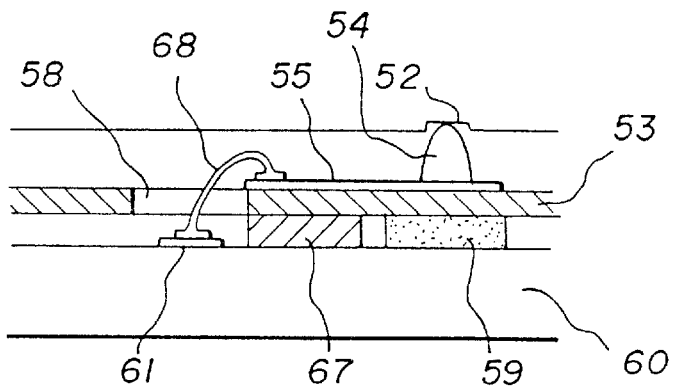
FIG. 17 is a diagram for explaining a second embodiment of the present invention.

FIG. 17 illustrates this second embodiment where the wiring 55 on the flexible substrate 53 is coupled with the internal terminal 61 on the multi-layer substrate 60 by a bonding wire 68 in order to compensate for stress, while stress between the wafer 51 and multi-layer substrate 60 was compensated by the level transitioning portion 56 of the wiring 55 in the first embodiment. In order to conduct wire bonding to the wiring 55, it is preferable to provide a spacer 67 to the lower side. This spacer also provides the effect, as illustrated in an example of FIG. 14, in which the distance between the flexible substrate 53 and multi-layer substrate 60 can be kept constant.

Figure 18:
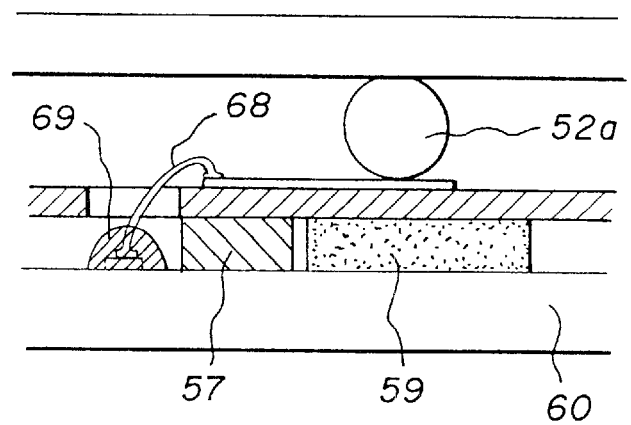
FIG. 18 is a diagram illustrating a modification of the second embodiment of the present invention.

FIG. 18 illustrates the coupling portion between the bonding wire 68 and internal terminal 61 being reinforced by resin 69. Thereby, if intensified stress is applied to the coupling portion, damage to the coupling area can be prevented by the resin 69 and the effect for absorbing stress can also be enhanced. Reinforcement of the coupling area by this resin 69 can also be applied to the Cu foil lead used in the first embodiment.

Figure 19:
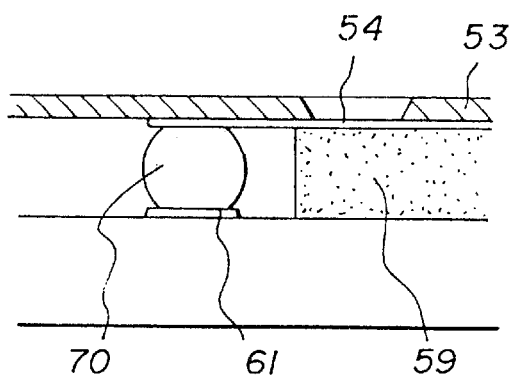
FIG. 19 is a diagram illustrating a modification of the second embodiment of the present invention.

FIG. 19 illustrates the wiring 55 on the flexible substrate 53 being coupled with the internal terminal 61 on the multi-layer substrate 60 with a solder ball 70 to compensate for stress between the wafer 51 and the multi-layer substrate 60. The solder ball 70 is formed at the predetermined position on the flexible substrate 53 or on the multi-layer substrate 60 by the plating method, transfer method, or printing method, or the like. Positioning is made to the flexible substrate 53 and the multi-layer substrate 60, and the solder 70 is fused by the heating process to realize bonding therebetween. With the structure explained above, many bonding areas of the flexible substrate 53 and multi-layer substrate 60 can be coupled simultaneously with the solder ball 70.

FIG. 20 illustrates an example wherein stress to be applied on the connecting terminal and bonding wire can be minimized by providing the connecting terminal and bonding wire in a particular direction. As is explained with regard to FIG. 7, when the temperature load is applied at the time of testing the wafer, the difference of thermal expansion coefficients of the wafer 51 and multi-layer substrate creates stress to the connecting terminal and bonding wire. This stress is spread, in this case, radially outward from a center of the flexible substrate 53, as shown by the arrows in FIG. 20.

Therefore, as illustrated in FIG. 20, the direction in which stress spreads is matched with the direction where the level transitioning portion 56 of the wiring 55 can be compressed or extended most easily, i.e. by extending the wiring 55 in the radial direction from the center O of the flexible substrate 53 at each area A, B, C of the flexible substrate 53. Thereby, the stress compensation capability of the level transitioning portion 56 can be maximized. FIG. 20 illustrates the beam lead in which the connecting terminal is formed of Cu foil. When the bonding wire 68 is used, a similar effect can also be obtained by providing the wire 68 in the radial direction from the center O of the flexible substrate 53.

Here, when the wiring between the contact electrode and connecting terminal is laid in zig-zag, stress can be further compensated.

FIG. 21 is a diagram for explaining the optimum temperature for coupling the connecting terminal 57 to the internal terminal 61. In some cases, the wafer 51 is tested by the burn-in test through application of repeated temperature cycles between a high temperature of about 125° C. and a normal temperature of about 25° C. In this case, when the connecting terminal 57 is coupled with the internal terminal 61 at an intermediate temperature of about 75° C., the level transitioning portion 56 moves as indicated by a dotted line of FIG. 21 during the high temperature period and normal temperature period. Thus, stress generated by the difference of thermal expanding coefficients of the wafer 51 and the multi-layer substrate 60 can be compensated most effectively.

Moreover, at the time of conducting the burn-in test under a constant temperature (125° C.), when the contact condition between the wafer 51 and the contact electrode 54 can be fixed, positional deviation is not generated due to the difference of the thermal expansion coefficients of the wafer 51 and the contact electrode 54. Under the normal temperature, the wafer is placed on the flexible substrate without giving any contact pressure between the wafer 51 and the flexible substrate 53. The position is maintained by contact pressure applied when the wafer electrode 52 is matched with the contact electrode 54 under the test temperature. In this case, the position of the contact electrode on the flexible substrate 53 must correspond to the position of the wafer electrode 52 under the test temperature.

Figure 22:
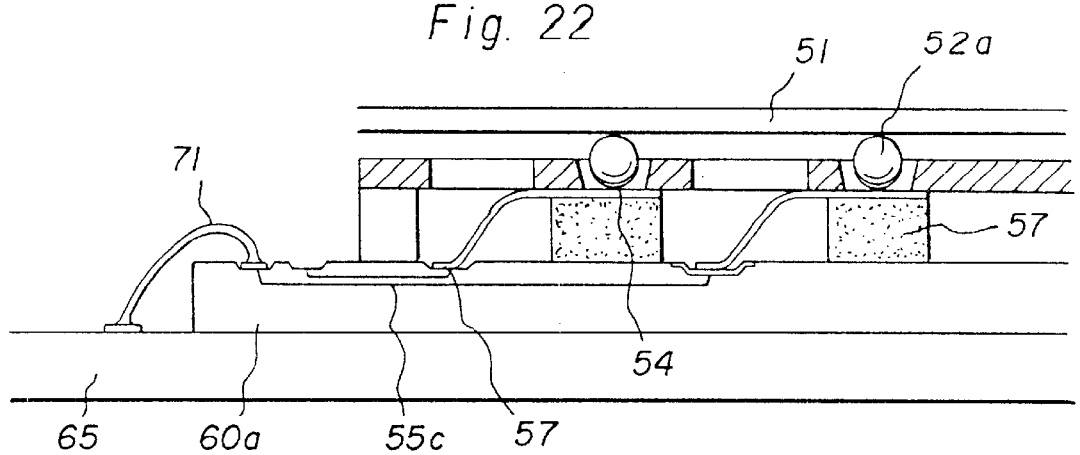
FIG. 22 is a diagram illustrating a modification of the second embodiment of the present invention.

FIG. 22 illustrates a silicon (Si) wafer 60a as the multi-layer substrate 60 illustrated in FIG. 5. In the wafer 60a constituting the multi-layer substrate, an internal wiring layer 55c is formed, with one end connected to the connecting terminal 57 coupled with the contact electrode 54 and the other end connected to the bonding wire 71 coupled with the burn-in board 65.

When the multi-layer substrate is the Si wafer 60a as explained above, the thermal expansion coefficient may be set identical to that of the test object wafer 51. And, if the temperature load is applied at the time of burn-in test, stress is not applied to the connecting terminal portion.

Moreover, since the multi-layer substrate can be formed by a wafer fabrication process, a fine wiring can also be formed and easily extended.

In addition, when a test support circuit is formed on the wafer 60a, the load of the burn-in test apparatus can be eased by reducing the number of channels. At the time of conducting the function test for the wafer to be tested in addition to the burn-in apparatus, when the multi-layer substrate 60a is used, wiring length can be expanded by a fine process in view of improving the high speed test characteristic.

In an example of FIG. 22, the maximum effect can be obtained when the test object is the wafer 51, but this method can also be applied to each piece of chip.

(Third Embodiment; Loading the Support Circuit)

Figure 23:
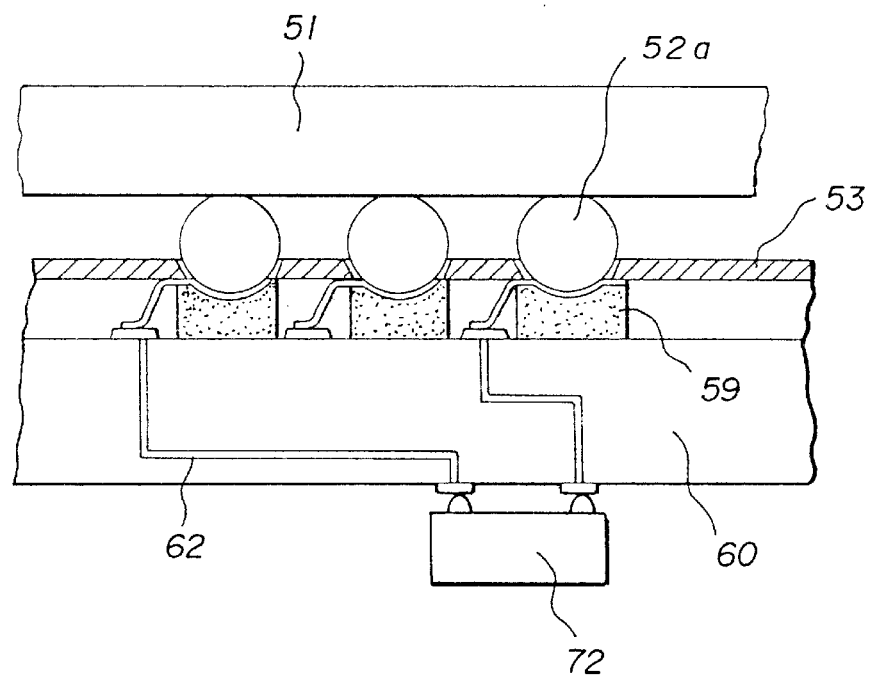
FIG. 23 is a diagram illustrating a third embodiment of the present invention.

FIG. 23 illustrates the multi-layer substrate 60 wherein a semiconductor chip 72 is provided to support the test of the wafer 51. This chip 72 is not limited to a semiconductor chip having electronic circuits, and is accompanied, in some cases, by chip parts such as resistors and capacitors or the like. Moreover, a protection resistor for preventing breakdown of the wafer 51 from an excessive current may be added.

(Fourth Embodiment; CSP in the Wafer Condition as the Test Object)

Figure 2:
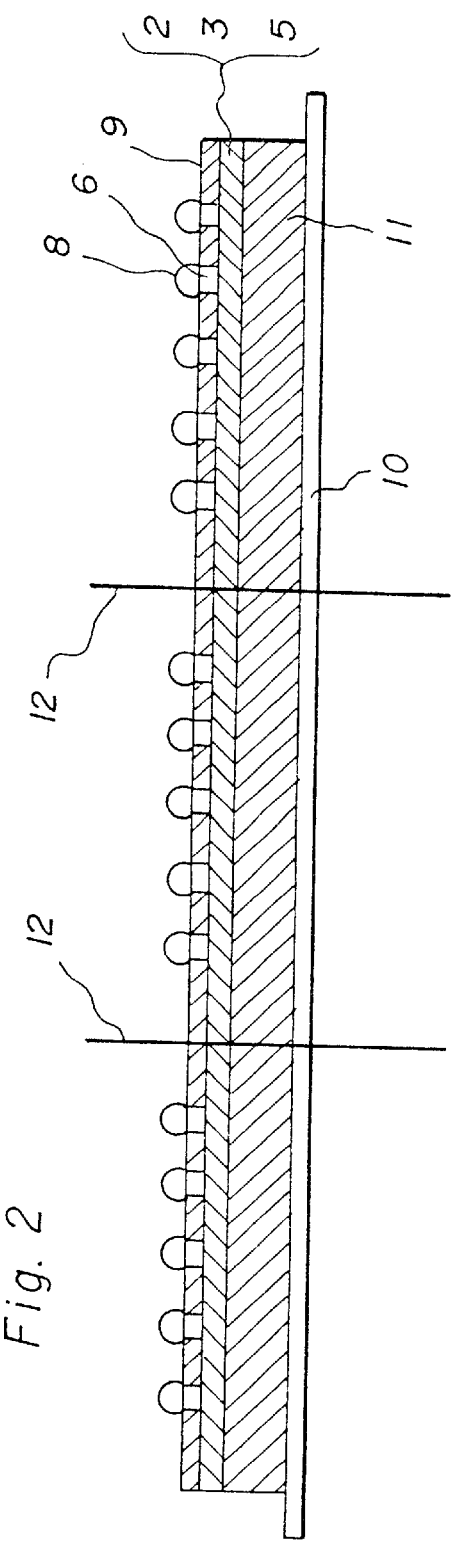
FIG. 2 is a cross-sectional view for explaining the CSP in the wafer condition.
Figure 3:
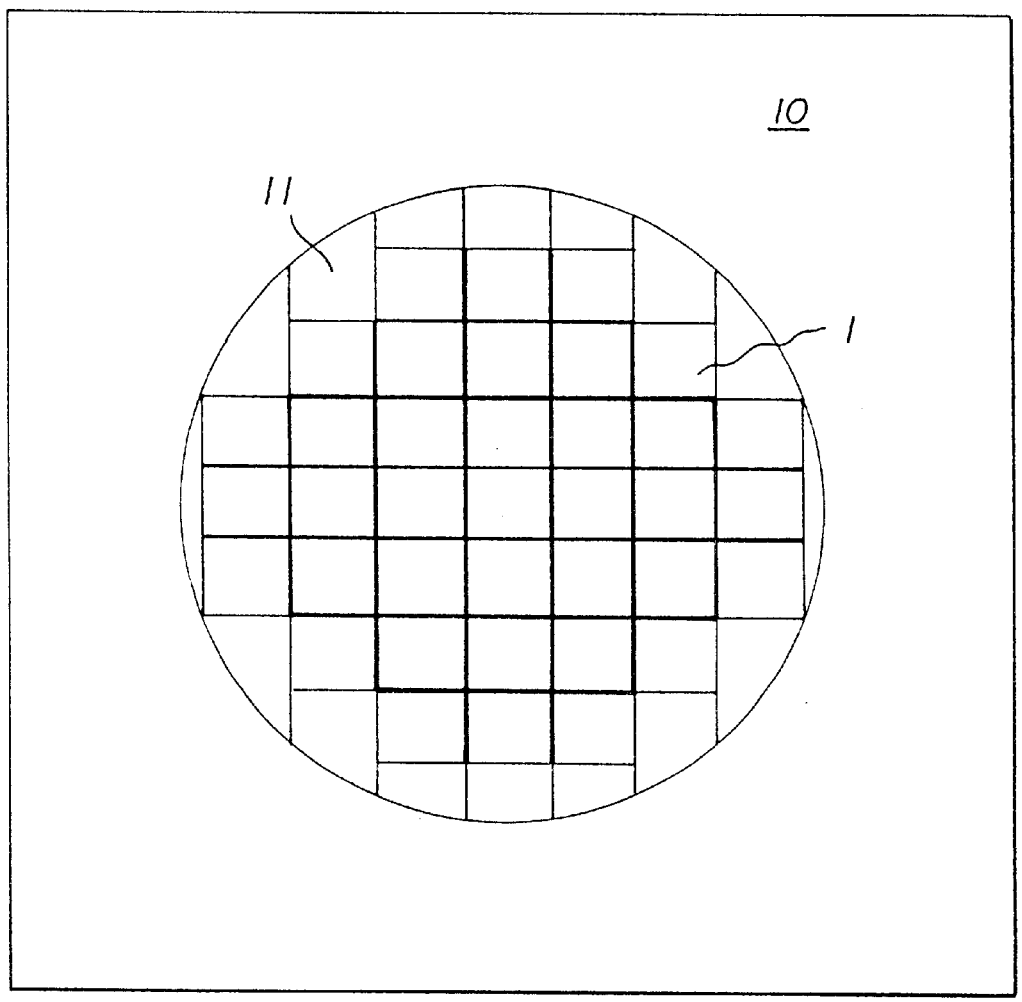
FIG. 3 is a plan view for explaining the CSP in the wafer condition.
Figure 24A:
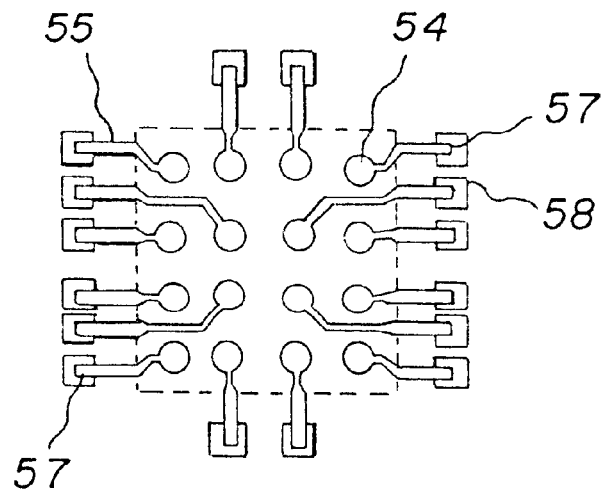
FIGS. 24(a) to 24(c) are diagrams illustrating a fourth embodiment of the present invention.
Figure 24B:
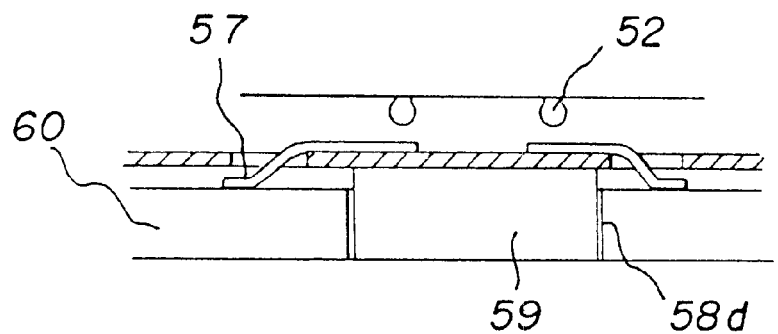
Figure 24C:
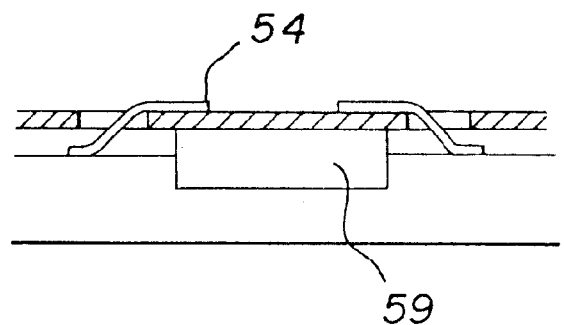

FIGS. 24(a) to 24(c) illustrates a CSP in the wafer condition described in FIGS. 1 to 3 which are effective for the test. The connecting terminal 57 is led to the external side of the dicing line (dotted line) or the outer most circumference of the electrode of CSP via the wiring 55 from the contact electrode 54 being contact with the electrode of each CSP. Since the connecting terminal 57 is located externally of the dicing line, as illustrated in FIG. 24(b), the aperture 58d can be provided to the multi-layer substrate 60 underneath each CSP. Reliable contact with the CSP electrode and contact electrode 54 can be assured by embedding the elastic material 59 such as rubber or the like into this aperture.

The aperture 58d is not required to be a through-hole as in FIG. 24(b) and it is also possible to bury the elastic material 59 by providing a recess in the multi-layer substrate 60, as shown in FIG. 24(c).

(Fifth Embodiment; Flexible Substrate is Divided into Small Sections)

Figure 25:
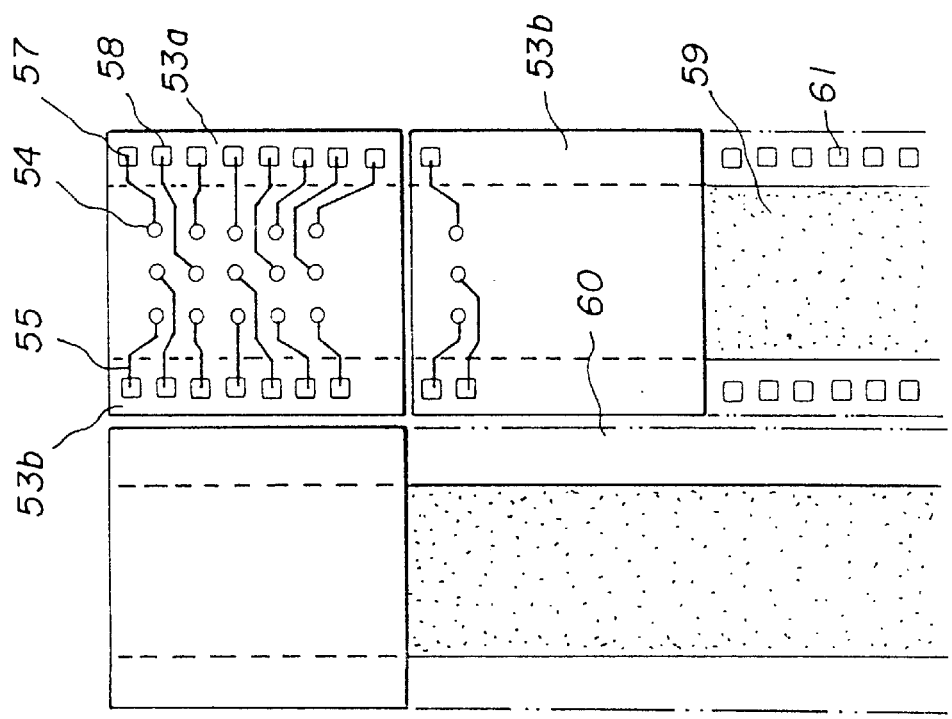
FIG. 25 is a diagram illustrating a fifth embodiment of the present invention.

FIG. 25 illustrates the fifth embodiment of the present invention.

The flexible substrates 53a, 53b of this embodiment are set to the size corresponding to the chip to be tested as illustrated in the figure and it is a little larger than the chip. In each flexible substrate 53a, 53b, the contact electrode 54 is formed at the respective surfaces and the wiring 55 is connected to the contact electrode 54, guided to the circumference of the flexible substrate 53a, 53b and is then connected to the connecting terminal 57. At the lower side of the contact electrode 54, an elastic material 59 is provided.

Since the flexible substrate 53a, 53b is provided for each chip, if a failure is generated at a part of the contact electrode, the wiring, or the connecting terminal, the wafer contactor 74 can be repaired easily only by replacing the flexible substrate having the defective part.

Figure 26:
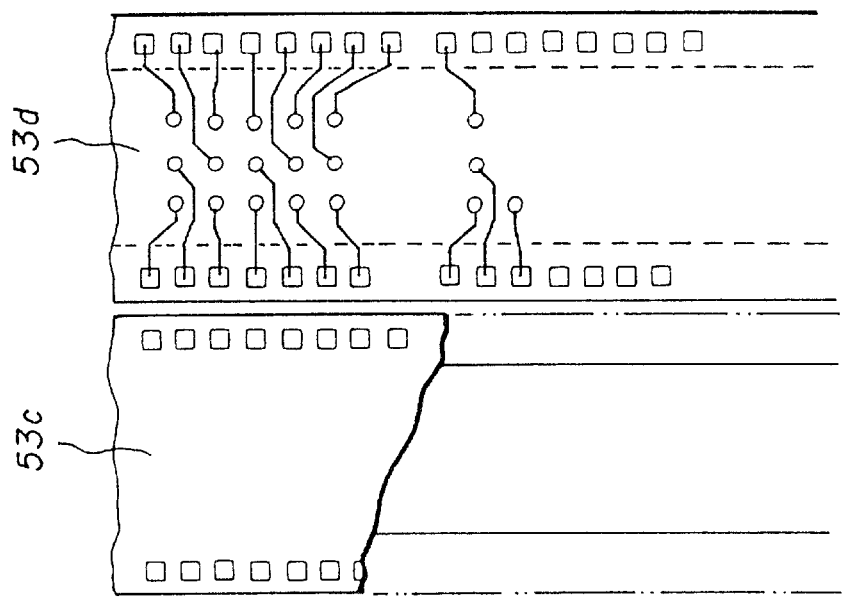
FIG. 26 is a diagram illustrating a modification of the fifth embodiment of the present invention.

FIG. 26 illustrates a modification of this embodiment in which the flexible substrates 53c, 53d are provided in the narrow rectangular shape for each line corresponding to a line of chips on the wafer to be tested. With this structure, easier repair may be assured and the manufacturing processes may be reduced than that of the case where the flexible substrate is provided for each chip illustrated in FIG. 25.

(Sixth Embodiment; Contact Electrodes are Arranged like a Matrix)

Figure 27A:
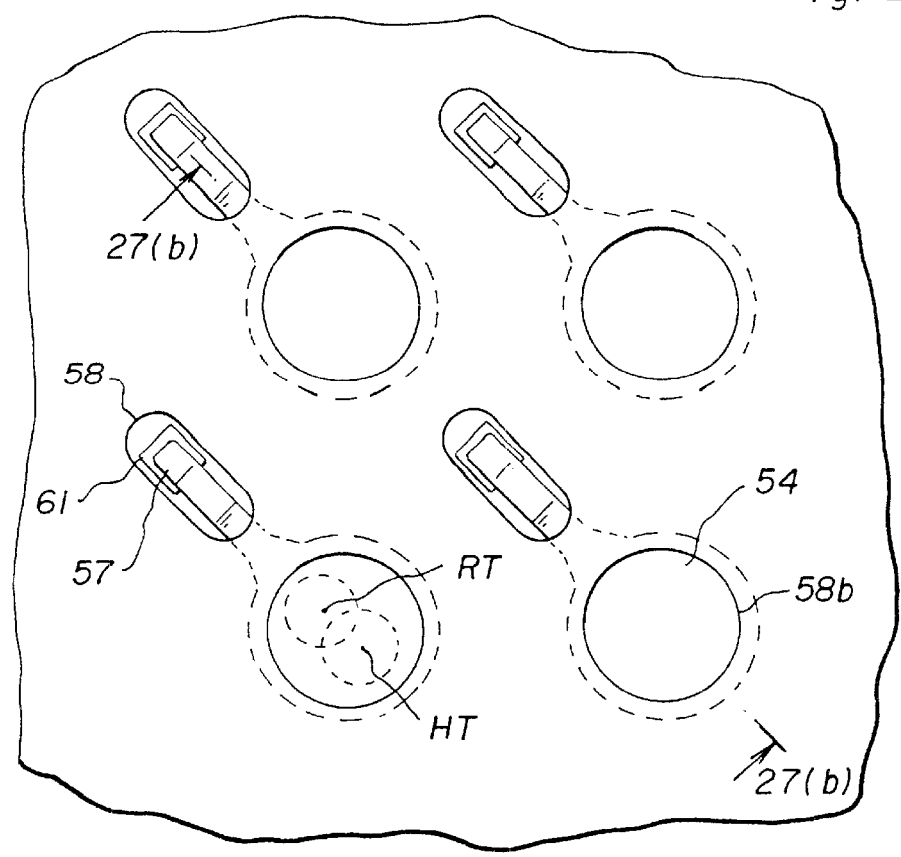
FIGS. 27(a) and 27(b) are diagrams illustrating a sixth embodiment of the present invention.
Figure 27B:
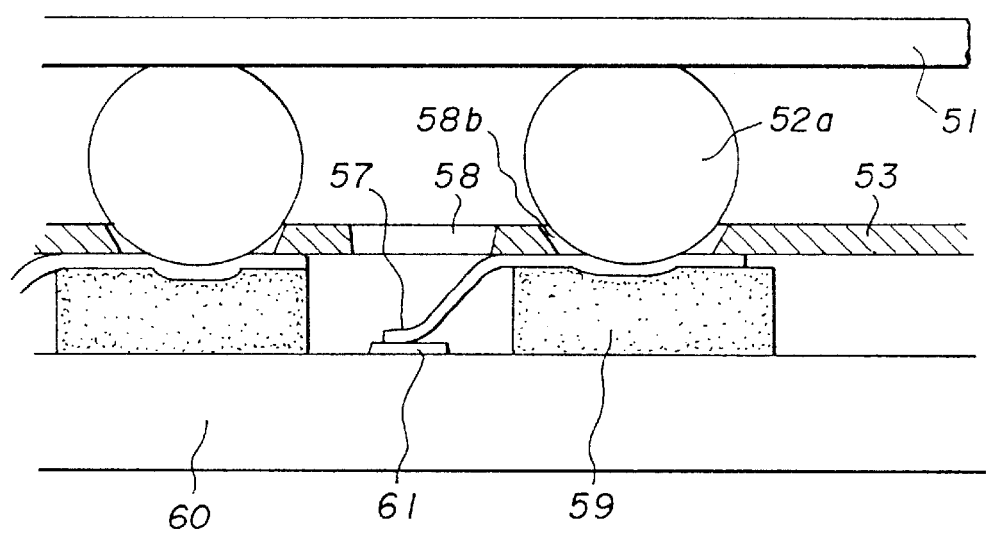

FIGS. 27(a) and 27(b) illustrate another embodiment of the method for testing the CSP in the wafer condition. FIG. 27(a) is a plan view of the flexible substrate 53. FIG. 27(b) is a cross-sectional view of the condition where the bump 52a provided on the electrode of the CSP is in contact with the contact electrode 54.

As illustrated in the figures, the contact electrodes 54 which are in contact with the bumps 52a (arranged like a matrix on the CSP), are exposed from the flexible substrate 53 via the aperture 58b. The wiring extended from the contact electrode 54 is bent to the lower side at the lower part of the aperture 58 and coupled by the connecting terminal 57 with the internal terminal 61 on the multi-layer substrate 60.

The position where the connecting terminal 57 is located is at the area between respective contact electrodes 54 and these positions are also arranged in the shape of matrix, like the bumps 52a of the CSP. Since an interval of the bumps 52a for formation of CSP is usually not so narrow, if it is not required to expand the pitch of contact 54 with the wiring 55, the connecting terminal 57 may be arranged in the matrix shape without expanding the pitch as in the case of this embodiment.

Since the electrode interval of the CSP is comparatively wide, two contact positions (a contact position RT under normal room temperature and a contact position HT under high temperature) may be provided on one contact electrode 54. The dotted lines around RT, HT respectively indicate the areas where the contact positions may fluctuate under normal temperature and under high temperature.

FIGS. 28(a), 28(b) illustrate a modification of the sixth embodiment. FIG. 28(a) is a plan view of the flexible substrate 53 and FIG. 28(b), a cross-sectional view.

Like the embodiment illustrated in FIG. 27, the contact electrodes 54 are formed in matrix shape on the flexible substrate 53 and the wiring 55d is extended to the end of the flexible substrate 53 from the predetermined contact electrode 54. When the electrode pitch of CSP is not so narrow, the wiring 55 can be connected with the contact electrode 54 as explained above. The wiring 55d may be provided on the surface of the flexible substrate 53 opposite the connecting terminal 57 as illustrated in FIG. 28(b), or may be provided in the same side.

As explained above, it is now possible that an electronic circuit for supporting the test, and chip parts such as resistor and capacitor, may be added on the flexible substrate 53 by leading the wiring from the contact electrode 54 on the flexible substrate 53. Therefore, the load of the test apparatus may be reduced and a power supply voltage can also be stabilized.

As explained above, according to the probe card and the method of testing the wafer having a plurality of semiconductor devices of the present invention, it is possible to assure a good contact with each chip and electrode pad of the CSP without use of multi-layer ceramics substrate and anisotropic conductive rubber, to widen a narrow wafer electrode pitch, and also to assure excellent durability under high temperatures.

The present invention has been explained with reference to the preferred embodiments thereof, but the present invention is not limited to the embodiments explained above and various modifications and alterations may be made within the scope of the claims.

What is claimed is:

1. A method of testing a wafer having a plurality of semiconductor devices, comprising the steps of:

contacting an electrode on one of the plurality of semiconductor devices with a movable contact electrode on a probe card; and supplying a test signal to an external connecting terminal on a board of the probe card, through a wiring connecting the external connecting terminal to an external terminal on a periphery of a substrate of the probe card, through a wiring connecting the external terminal to an internal terminal on the substrate, and through a wiring having a level transitioning portion extending from the internal terminal at a level of the substrate and connecting to the contact electrode at a higher level.

2. A method of testing a wafer having a plurality of semiconductor devices, said method comprising:

contacting an electrode on one of the plurality of semiconductor devices with a contact electrode on a probe card;

supplying a test signal to an external connecting terminal on a board of the probe card, through a wiring connecting the external connecting terminal to an external terminal on a periphery of a substrate of the probe card, through a wiring connecting the external terminal to an internal terminal on the substrate, and through a wiring having a level transitioning portion extending from the internal terminal at a level of the substrate and connecting to the contact electrode at a higher level; and heating the wafer and the probe card, and compensating displacements of the internal terminal on the substrate by the level transitioning portion.

3. A method of testing a wafer having a plurality of semiconductor devices, said method comprising:

contacting an electrode on one of the plurality of semiconductor devices with a contact electrode on a probe card;

supplying a test signal to an external connecting terminal on a board of the probe card, through a wiring connecting the external connecting terminal to an external terminal on a periphery of a substrate of the probe card, through a wiring connecting the external terminal to an internal terminal on the substrate, and through a wiring having a level transitioning portion extending from the internal terminal at a level of the substrate and connecting to the contact electrode at a higher level; and heating a flexible substrate of the probe card, the substrate, and the wafer, the contact electrode being disposed on a surface of the flexible substrate facing the wafer, and compensating displacements of the internal terminal on the substrate by the level transitioning portion.

* * * * *